US010269846B2

(12) United States Patent
Manabe et al.

(10) Patent No.: US 10,269,846 B2
(45) Date of Patent: Apr. 23, 2019

(54) STORAGE GATE PROTECTION

(71) Applicant: OmniVision Technologies, Inc., Santa Clara, CA (US)

(72) Inventors: Sohei Manabe, San Jose, CA (US); Keiji Mabuchi, Los Altos, CA (US); Takayuki Goto, Foster City, CA (US); Dajiang Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/799,198

(22) Filed: Oct. 31, 2017

(65) Prior Publication Data
US 2018/0151610 A1 May 31, 2018

Related U.S. Application Data

(62) Division of application No. 15/362,391, filed on Nov. 28, 2016, now Pat. No. 9,859,311.

(51) Int. Cl.
*H01L 27/146* (2006.01)
*H01L 31/0232* (2014.01)

(52) U.S. Cl.
CPC .... *H01L 27/14623* (2013.01); *H01L 27/1461* (2013.01); *H01L 27/1464* (2013.01); *H01L 27/14614* (2013.01); *H01L 27/14643* (2013.01); *H01L 27/14685* (2013.01); *H01L 27/14689* (2013.01); *H01L 31/02327* (2013.01)

(58) Field of Classification Search
CPC ............. H01L 27/1464; H01L 27/1461; H01L 27/14614; H01L 27/14623; H01L 27/14625; H01L 27/14629; H01L 27/14643; H01L 27/14685; H01L 27/14689; H01L 31/02327
See application file for complete search history.

(56) References Cited

U.S. PATENT DOCUMENTS 7,531,884 B2   5/2009   Kim
7,768,086 B2   8/2010   Shibayama
9,356,061 B2   5/2016   Fan et al.
(Continued)

OTHER PUBLICATIONS

Taiwanese Office Action and Translation dated Dec. 6, 2018, for Taiwanese Application No. 106140862, filed Nov. 24, 2017, 19 pages.

*Primary Examiner* — Feifei Yeung Lopez
(74) *Attorney, Agent, or Firm* — Christensen O'Connor Johnson Kindness PLLC

(57) ABSTRACT

A method of backside illuminated image sensor fabrication includes forming a plurality of photodiodes in a semiconductor material, where the plurality of photodiodes are disposed to receive image light through a backside of the backside illuminated image sensor. The method further includes forming a transfer gate coupled to extract image charge from a photodiode in the plurality of photodiodes, and forming a storage gate coupled to the transfer gate to receive the image charge. Forming the storage gate includes forming an optical shield in the semiconductor material; depositing a gate electrode proximate to a frontside of the semiconductor material; and implanting a storage node in the semiconductor material, where the storage node is disposed in the semiconductor material between the optical shield and the gate electrode.

11 Claims, 6 Drawing Sheets

(56) References Cited

U.S. PATENT DOCUMENTS

| | | | |
|---|---|---|---|
| 9,842,875 B2 | 12/2017 | Fan et al. | |
| 2003/0207476 A1* | 11/2003 | Eriguchi | H01L 21/3065 438/16 |
| 2008/0017893 A1 | 1/2008 | Cazaux et al. | |
| 2008/0075474 A1 | 3/2008 | Kawai | |
| 2014/0002700 A1* | 1/2014 | Oishi | H04N 5/369 348/273 |
| 2014/0197301 A1 | 7/2014 | Velichko et al. | |
| 2014/0246568 A1* | 9/2014 | Wan | H01L 27/1461 250/214.1 |
| 2016/0111461 A1* | 4/2016 | Ahn | H01L 27/14614 250/208.1 |

* cited by examiner

STORAGE GATE PROTECTION

REFERENCE TO RELATED APPLICATION

This application is a divisional of U.S. application Ser. No. 15/362,391, filed on Nov. 28, 2016, the contents of which are incorporated herein by reference.

TECHNICAL FIELD

This disclosure relates generally to semiconductor fabrication, and in particular but not exclusively, relates to storage gate construction.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

For high-speed image sensors, a global shutter can be used to capture fast-moving objects. A global shutter typically enables all pixel cells in the image sensor to simultaneously capture the image. For slower moving objects, the more common rolling shutter is used. A rolling shutter normally captures the image in a sequence. For example, each row within a two-dimensional ("2D") pixel cell array may be enabled sequentially, such that each pixel cell within a single row captures the image at the same time, but each row is enabled in a rolling sequence. Accordingly, each row of pixel cells captures the image during a different image acquisition window. For slow moving objects the time differential between each row generates image distortion. For fast-moving objects, a rolling shutter causes a perceptible elongation distortion along the object's axis of movement.

To implement a global shutter, storage structures can be used to temporarily store the image charge acquired by each pixel cell in the array while it awaits readout from the pixel cell array. Factors that affect performance in an image sensor pixel cell having a global shutter include shutter efficiency, dark current, white pixels and image lag. Moreover pollution of image charge in the storage structure may have a deleterious effect on image quality.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
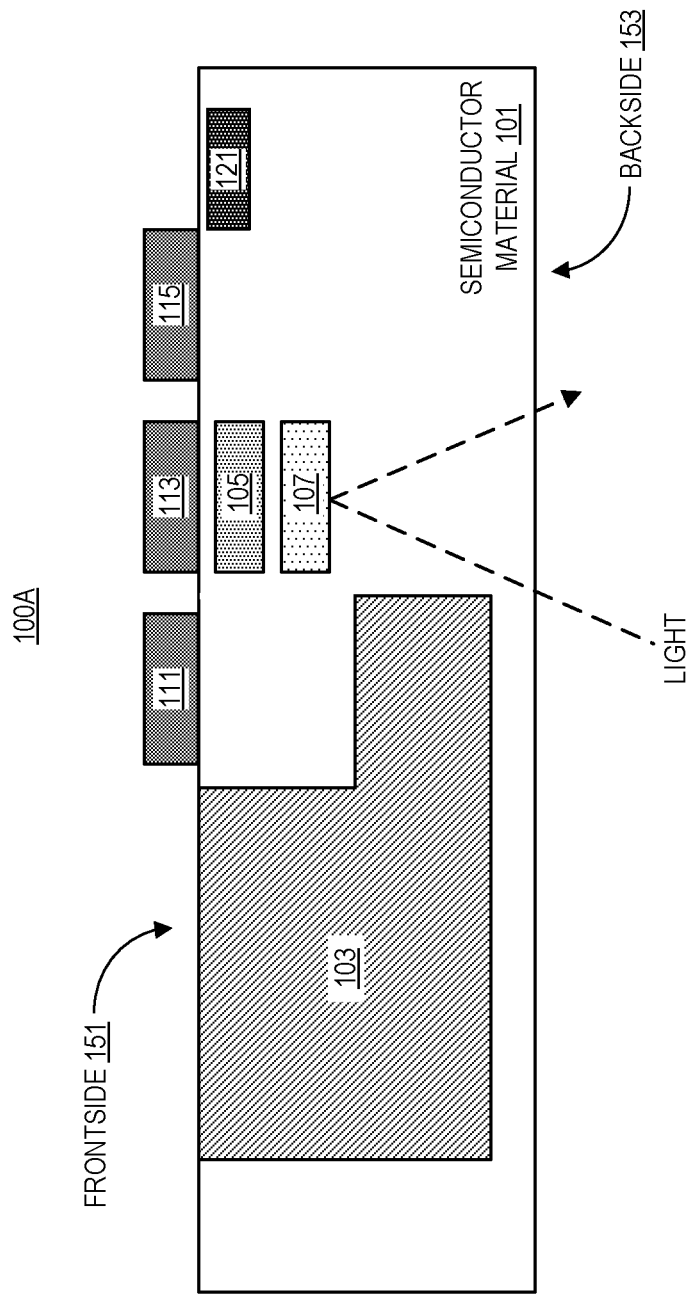
FIG. 1A is a cross sectional illustration of an example backside illuminated image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for storage gate protection in image sensors are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is a cross sectional illustration of an example backside illuminated image sensor 100A. Image sensor 100A includes semiconductor material 101, photodiode 103, transfer gate 111, storage gate 113 (including storage node 105 and optical shield 107), output gate 115, and floating diffusion 121. Semiconductor material 101 includes a plurality of photodiodes (see FIG. 2) disposed in semiconductor material 101 to receive image light through backside 153 of semiconductor material 101. Transfer gate 111 is electrically coupled to photodiode 103 in the plurality of photodiodes to extract image charge from photodiode 103. Storage gate 113 is electrically coupled to transfer gate 111 to receive the image charge from transfer gate 111. As illustrated, storage gate 113 includes a gate electrode (portion 113 raised above semiconductor material 101) disposed proximate to frontside 151 of semiconductor material 101, an optical shield 107 disposed in semiconductor material 101, and a storage node 105 disposed between the gate electrode and optical shield 107. Optical shield 107 is optically aligned with storage node 105 to prevent the image light incident on backside illuminated image sensor 100A from reaching storage node 105. In the depicted example, storage node 105 and optical shield 107 are at least partially laterally coextensive with each other, as well as the gate electrode of storage gate 113.

In the depicted example, optical shield 107 is freestanding in semiconductor material 101, and may include at least one of silicon oxide or germanium. As will be described in greater detail later, this free standing optical shield 107 may be formed without any etching steps by implanting, and subsequently annealing, impurity atoms. This provides a way to entirely reflect or absorb light traveling towards storage node 105; an otherwise difficult task in a backside illuminated image sensor. One skilled in the art will appreciate that the low index of refraction of silicon oxide may be used to reflect certain wavelengths and indices of light, while germanium (or GeSi in the case of a silicon semiconductor material 101) may absorb light traveling towards storage node 105.

Also depicted is photodiode 103 extending into semiconductor material 101 from frontside 151 a certain depth. As shown, in some examples, at least part of photodiode 103 is disposed proximate to backside 153 of semiconductor material 101 and is laterally coextensive with transfer gate 111. In other words, a portion of photodiode 103 and transfer gate 111 overlap in a vertical direction. Moreover the width of photodiode 103 proximate to frontside 151 is smaller than the width of photodiode 103 proximate to backside 153. As shown, the wider portion of photodiode 103 may be laterally coextensive with the active region of transfer gate 111 and the gate electrode of transfer gate 111. In other words, at least part of the photodiode 103 is disposed proximate to backside 153 and is optically aligned with an active region of transfer gate 111. Photodiode 103 absorbs at least some of the image light before the image light reaches the active region of transfer gate 111. In some examples, this may be useful since photodiode 103 may absorb some of the light that otherwise could be absorbed by the active region of transfer gate 111 and degrade image signal quality.

Figure 1B:
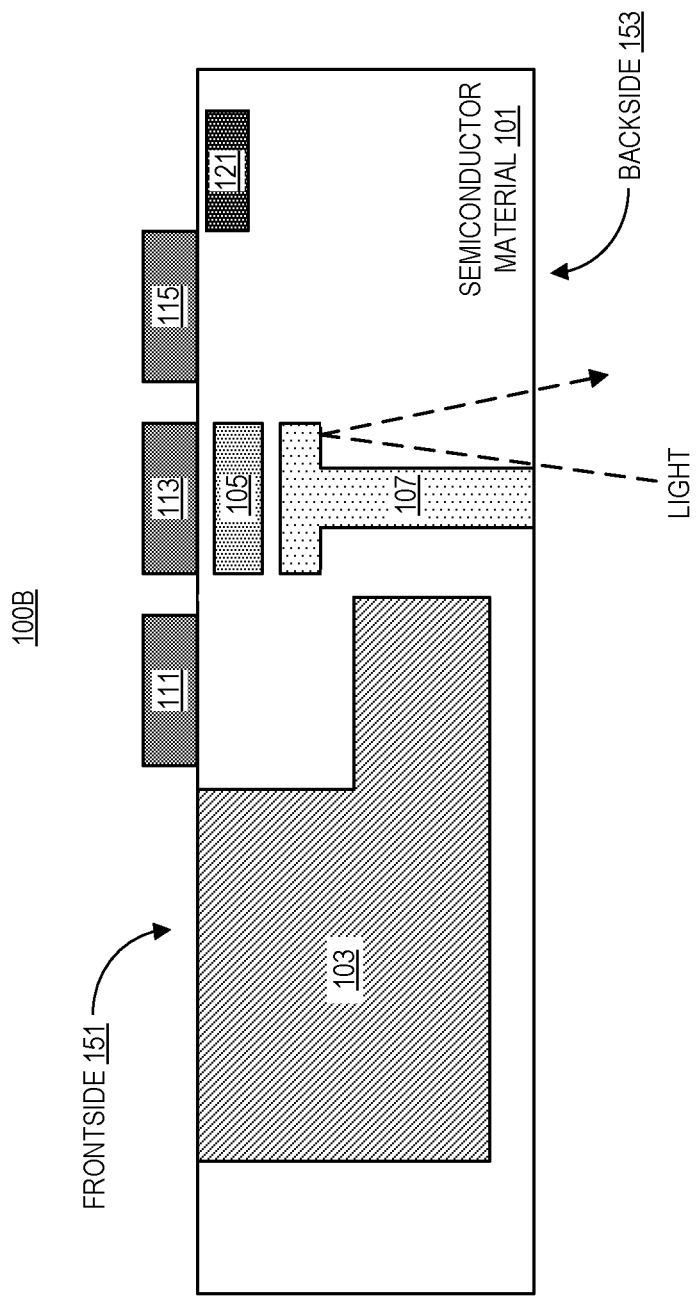
FIG. 1B is a cross sectional illustration of an example backside illuminated image sensor, in accordance with the teachings of the present invention.

FIG. 1B is a cross sectional illustration of an example backside illuminated image sensor 100B. Backside illuminated image sensor 100B is similar in many respects to image sensor 100A in FIG. 1A; however, backside illuminated image sensor 100B has a substantially "T" shaped optical shield 107 that, as will be explained later, is fabricated in a different way than optical shield 107 in FIG. 1A. As illustrated, optical shield 107 extends from backside 153 into semiconductor material 101, and a portion of optical shield 107 closest to frontside 151 is wider than a portion of optical shield 107 closest to backside 153. In other words, the top of the "T" shaped structure is laterally wider than the column section of the "T". In the depicted example, optical shield 107 may include at least one of an oxide or a metal. More specifically, optical shield 107 may be lined with silicon oxide and may be filled with a metal, high-K oxide, semiconductor, or any combination of the aforementioned.

Figure 1C:
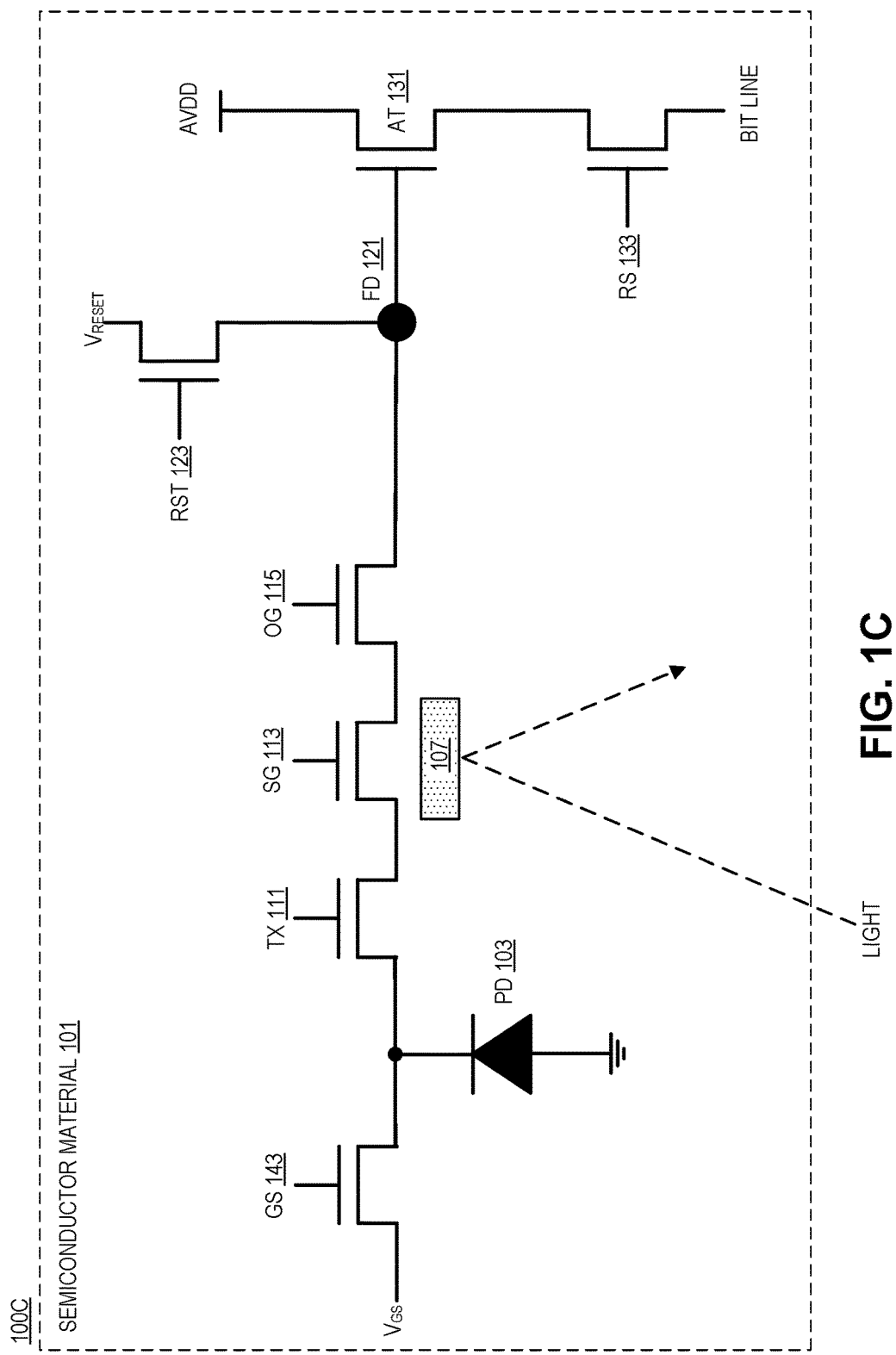
FIG. 1C is a circuit diagram of the image sensor in FIGS. 1A-1B, in accordance with the teachings of the present invention.

FIG. 1C is an example circuit diagram of the image sensor in FIGS. 1A-1B. Pixel cell 100C has a global shutter in accordance with the teachings of the present invention. As shown, pixel cell 100 includes global shutter gate transistor 143, photodiode 103, transfer gate 111, storage gate 113 (including optical shield 107), output gate 115, floating diffusion 121, reset transistor 123, amplifier transistor 131, and row select transistor 133. In one example, the amplifier transistor 116 is implemented with a source follower coupled transistor. As shown global shutter gate transistor 143 is coupled between a $V_{GS}$ voltage and the photodiode 103.

In operation, global shutter gate transistor 143 is coupled to selectively deplete the image charge that has accumulated in photodiode 103 by selectively coupling photodiode 103 to voltage $V_{GS}$ in response to a global shutter signal. Photodiode 103 is disposed in semiconductor material 101 of pixel cell 100 to accumulate image charge in response to incident light directed to photodiode 103. Photodiode 103 is coupled to transfer gate 111 to transfer image charge accumulated in photodiode 103 to an input of the storage gate 113. Transfer gate 111 allows charge to flow from photodiode 103 into storage gate 113, in response to a transfer signal applied to the gate electrode of transfer gate 111.

In the depicted example, the storage gate 113 is illustrated as being optically isolated from image light by optical shield 107. As discussed above in connection with FIGS. 1A-1B, optical shield 107 prevents light incident on the backside of the image sensor from entering the storage node in storage gate 113. This prevents unwanted hole-electron pairs from forming in the storage node, and distorting image charge.

The example in FIG. 1C also illustrates that output gate 115 is coupled to an output of storage gate 113 to selectively transfer the image charge from the storage gate 113 to floating diffusion 121. Reset transistor 123 is coupled between a reset voltage $V_{RESET}$ and floating diffusion 121 to selectively reset the charge in floating diffusion 121 in response to a reset signal RST. Amplifier transistor 131 includes an amplifier gate coupled to floating diffusion 121 to amplify the signal on floating diffusion 121 to output image data from pixel cell 100C. Row select transistor 133 is coupled between the bitline and amplifier transistor 131 to output the image data.

Figure 2:
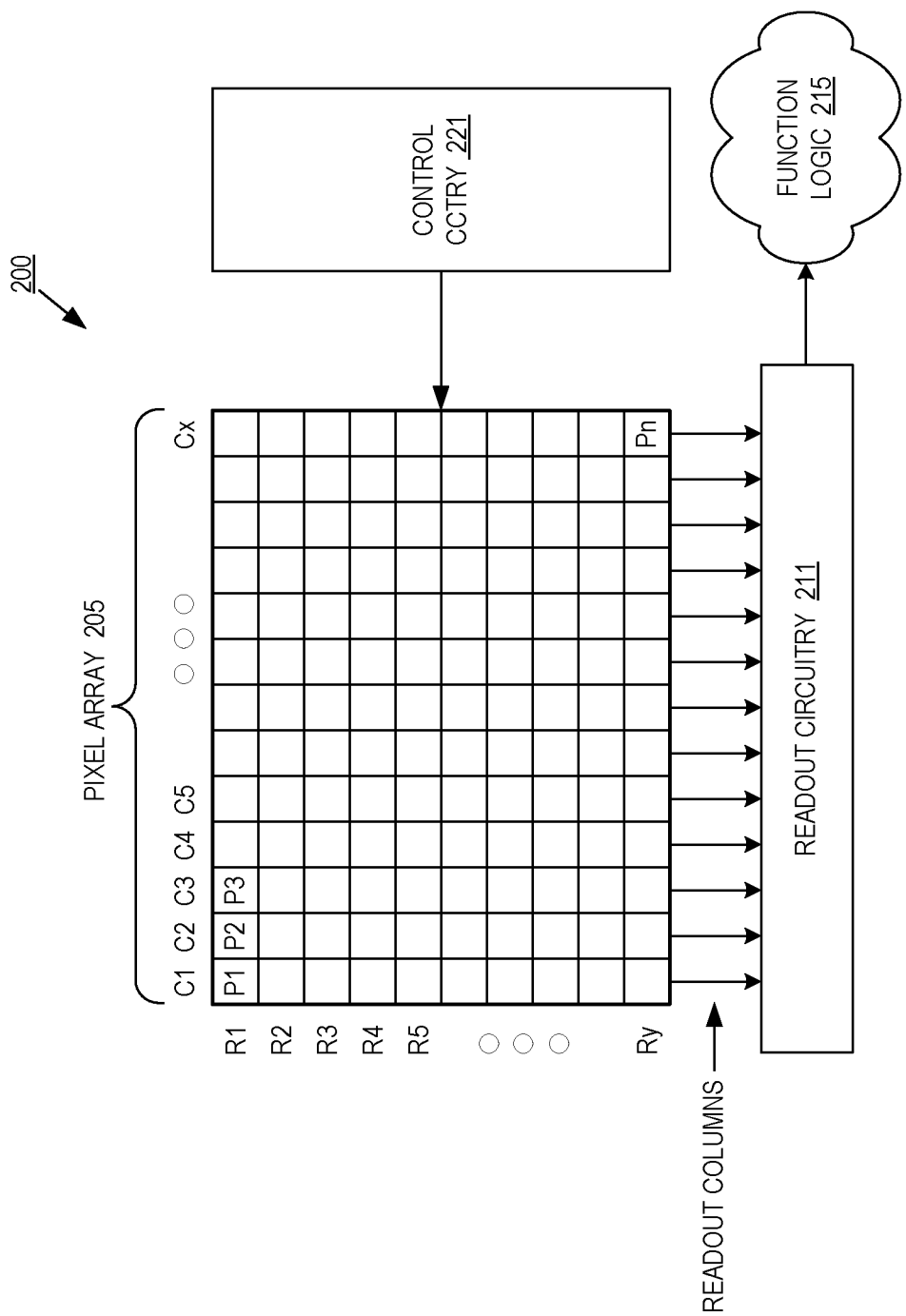
FIG. 2 is a block diagram illustrating one example of an imaging system which may include the image sensor of FIGS. 1A-1C, in accordance with the teachings of the present invention.

FIG. 2 is a block diagram illustrating one example of imaging system 200 which may include the image sensors of FIGS. 1A-1C. Imaging system 200 includes pixel array 205, control circuitry 221, readout circuitry 211, and function logic 215. In one example, pixel array 205 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 205 has acquired its image data or image charge, the image data is readout by readout circuitry 211 and then transferred to function logic 215. In various examples, readout circuitry 211 may include amplification circuitry, analog-to-digital (ADC) conversion circuitry, or otherwise. Function logic 215 may simply store the image data or even manipulate the image data by applying post image effects (e.g., crop, rotate, remove red eye, adjust brightness, adjust contrast, or otherwise). In one example, readout circuitry 211 may readout a row of image data at a time along readout column lines (illustrated) or may readout the image data using a variety of other techniques (not illustrated), such as a serial readout or a full parallel readout of all pixels simultaneously.

In one example, control circuitry 221 is coupled to pixel array 205 to control operation of the plurality of photodiodes in pixel array 205. For example, control circuitry 221 may generate a shutter signal for controlling image acquisition. In the depicted example, the shutter signal is a global shutter signal for simultaneously enabling all pixels within pixel array 205 to simultaneously capture their respective image data during a single acquisition window. In another example, image acquisition is synchronized with lighting effects such as a flash.

In one example, imaging system 200 may be included in a digital camera, cell phone, laptop computer, automobile or the like. Additionally, imaging system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 200, extract image data from imaging system 200, or manipulate image data supplied by imaging system 200.

Figure 3A:
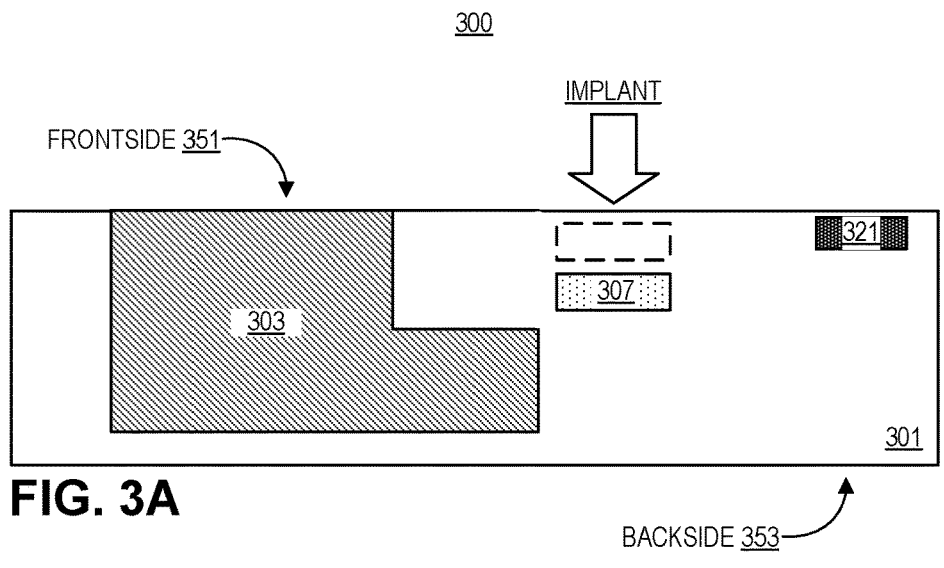
FIGS. 3A-3C illustrate an example method for forming the image sensor of FIG. 1A, in accordance with the teachings of the present invention.
Figure 3B:
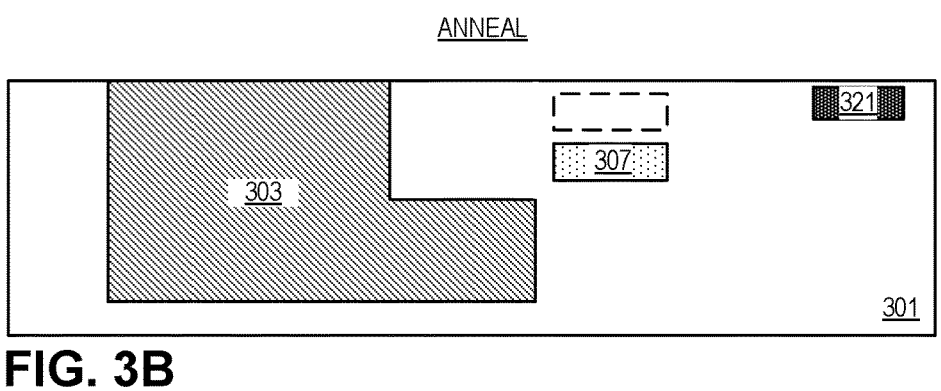
Figure 3C:
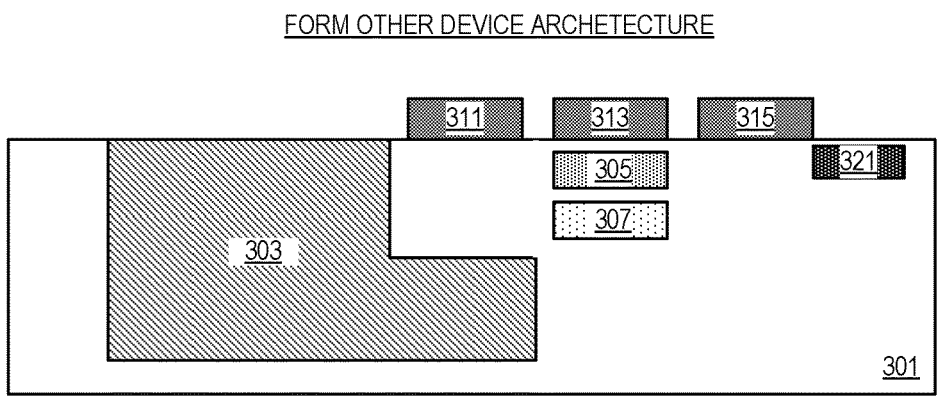

FIGS. 3A-3C illustrate an example method 300 for forming the image sensor of FIG. 1A. The order in which some or all illustrations appear in method 300 should not be deemed limiting. Rather, one of ordinary skill in the art having the benefit of the present disclosure will understand that some of method 300 may be executed in a variety of orders not illustrated, or even in parallel. Furthermore, method 300 may omit certain illustrations in order to avoid obscuring certain aspects. Alternatively, method 300 may include additional illustrations that may not be necessary in some embodiments/examples of the disclosure.

FIG. 3A illustrates providing a plurality of backside illuminated photodiodes 303 in semiconductor material 301 along with floating diffusion 321. To form optical shield 307, an impurity element is implanted between backside 353 and a location of the storage node (depicted as an empty dashed-line box since, in the illustrated example, no storage node is formed yet). In one example, the impurity element may be oxygen, germanium, or any other suitable element or combination of elements. Although in the depicted example, the impurity is implanted through frontside 351, in other examples, the impurity element may be implanted through backside 353.

FIG. 3B depicts annealing the implanted elements to from a chemical compound with the semiconductor material 301. In one example, the semiconductor material 301 includes silicon and the implanted impurity elements form either $SiO_2$ or SiGe. Both of these chemical compositions of optical shield 307 may help block light traveling to storage node 305. For example, the low index of refraction of silicon dioxide may reflect light traveling towards storage node 305, conversely the narrow bandgap of SiGe may allow for absorption of a broad range of wavelengths of light, including infra-red light and the like.

FIG. 3C illustrates forming additional image sensor device architecture. For example, transfer gates 311 are formed and they couple to extract image charge from photodiode 303 in the plurality of photodiodes. Other components of storage gate 313 are formed, such that storage gate 313 couples to transfer gate 311 to receive the image charge. For example, the gate electrode is deposited proximate to frontside 351 of semiconductor material 301, and storage node 305 is implanted in semiconductor material 301 (e.g., with ion beam implantation or the like). Storage node 305 is disposed in semiconductor material 301 between optical shield 307 and the gate electrode.

Figure 4A:
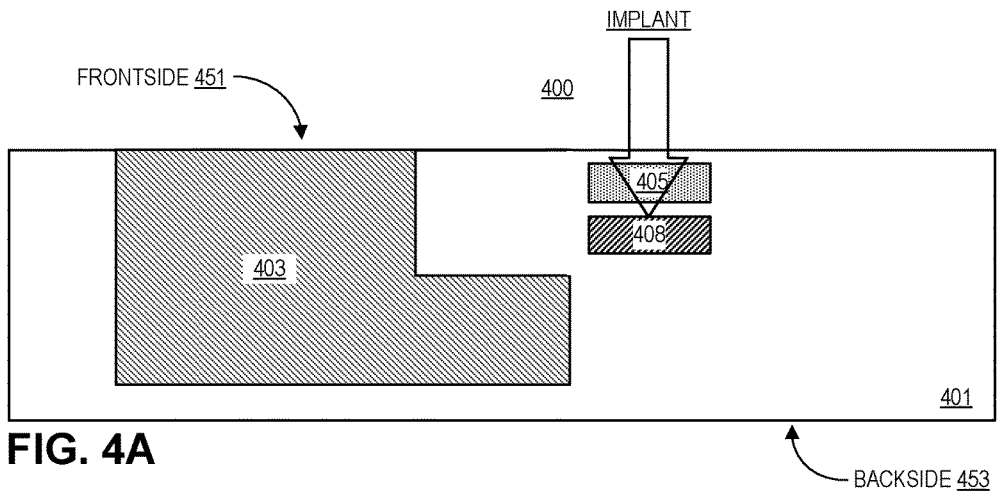
FIGS. 4A-4C illustrate an example method for forming the image sensor of FIG. 1B, in accordance with the teachings of the present invention.
Figure 4B:
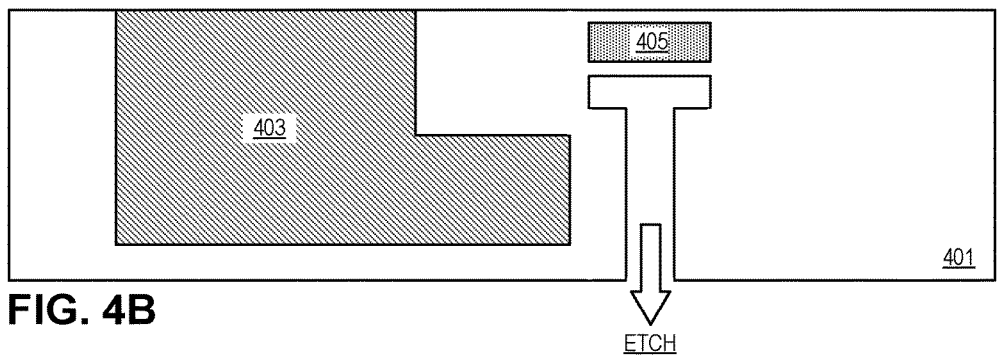
Figure 4C:
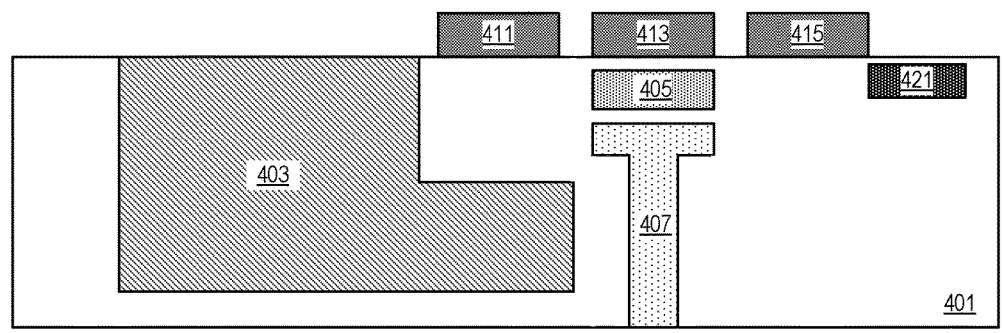

FIGS. 4A-4C illustrate an example method 400 for forming the image sensor of FIG. 1B. The order in which some or all illustrations appear in method 400 should not be deemed limiting. Rather, one of ordinary skill in the art having the benefit of the present disclosure will understand that some of method 400 may be executed in a variety of orders not illustrated, or even in parallel. Furthermore, method 400 may omit certain illustrations in order to avoid obscuring certain aspects. Alternatively, method 400 may include additional illustrations that may not be necessary in some embodiments/examples of the disclosure.

FIG. 4A illustrates implanting first dopant though frontside 451 of semiconductor material 401 to form first dopant region 408 between frontside 451 and a location of the storage node 405. In the depicted example, storage node 405 has already been formed; however, in other examples (like the example depicted in FIG. 3A) storage node 405 may not have been formed.

FIG. 4B shows etching a trench from backside 453 of semiconductor material 401 into first dopant region 408. In this example, the implant dopant (e.g., nitrogen) damaged the crystal lattice of semiconductor material 401 between frontside 451 and the location of storage node 405. Etching the trench preferentially removes the crystal lattice that was damaged by the first dopant. This may produce a trench with a substantially "T" shaped structure. Etching of semiconductor material 401 may be accomplished by wet or dry etch depending on other processing considerations and the geometries formed. In the depicted example, the horizontal component of the substantially "T" shaped structure is at least partially laterally coextensive with storage node 405 to prevent image light from reaching storage node 405. In other examples the horizontal component may have larger lateral bounds than the lateral bounds of storage node 405 or may even extend around the edges of storage node 405 to partially encircle storage node 405.

FIG. 4C shows backfilling the trench with at least one of a high-k material or an oxide to form optical shield 407. In the depicted example, a second dopant (e.g., boron) is implanted in semiconductor material 401 to compensate for inadvertent nitrogen doping in the region of semiconductor material 401 that the storage node 405 is formed in. Moreover after etching the trench, the interior of the trench may be oxidized to form a liner (e.g., $SiO_2$). Once the liner is formed, a high k-oxide, metal, or semiconductor may be deposited in the trench. As stated above, the various optical and electronic properties of these materials may be used to prevent light from reaching storage node 405.

Also depicted is forming additional pieces of device architecture such as photodiode 403. In one example, forming the plurality of photodiodes includes forming a region of photodiode 403 that is at least in part laterally coextensive with an active region of transfer gate 411. Thus photodiode 403 is positioned to absorb at least a portion of the image light directed toward the active region of transfer gate 411 before the portion of the image light reaches the active region. Moreover FIG. 4C shows forming output gate 415 electrically coupled to storage gate 413 to output the image charge from storage gate 413. FIG. 4C also shows implanting floating diffusion 421 in frontside 451 of semiconductor material 401, and floating diffusion 421 is coupled to output gate 415 to receive the image charge. Although not illustrated in FIG. 4C, an amplifier transistor may also be formed to be coupled to floating diffusion 421 to amplify the image charge in floating diffusion 421.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of backside illuminated image sensor fabrication, comprising:
    forming a plurality of photodiodes in a semiconductor material, wherein the plurality of photodiodes are disposed to receive image light through a backside of the backside illuminated image sensor;
    forming a transfer gate coupled to extract image charge from a photodiode in the plurality of photodiodes; and
    forming a storage gate coupled to the transfer gate to receive the image charge, wherein forming the storage gate includes:
        forming an optical shield disposed within the semiconductor material;
        depositing a gate electrode proximate to a frontside of the semiconductor material, wherein the frontside is opposite the backside; and
        implanting a storage node in the semiconductor material, wherein the storage node is disposed in the semiconductor material between the optical shield and the gate electrode, and wherein the storage node, the optical shield, and the gate electrode are all at least in part laterally coextensive with each other.

2. The method of claim 1, wherein forming the optical shield includes:
    implanting a first dopant from the frontside of the semiconductor material to form a first dopant region between the backside and a location of the storage node;
    etching a trench from the backside of the semiconductor material into the first dopant region; and
    backfilling the trench with at least one of a metal or an oxide.

3. The method of claim 2, further comprising:
    implanting a second dopant with an opposite majority charge carrier type as the first dopant to compensate for the first dopant;
    after etching the trench, oxidizing the interior of the trench to form a liner; and
    depositing a high-k oxide in the trench.

4. The method of claim 3, wherein implanting the first dopant includes implanting nitrogen to damage a crystal lattice of the semiconductor material between the backside and the location of the storage node, and wherein etching the trench preferentially removes the crystal lattice that was damaged by the first dopant to produce a trench with a substantially "T" shaped structure.

5. The method of claim 4, wherein a horizontal component of the substantially "T" shaped structure is at least partially laterally coextensive with the storage node.

6. The method of claim 1, wherein forming the optical shield in the semiconductor material includes:
    implanting an impurity element between the backside and a location of the storage node; and
    annealing the impurity element.

7. The method of claim 6, wherein implanting the impurity element occurs through the frontside of the semiconductor material, and wherein the impurity element includes at least one of germanium or oxygen.

8. The method of claim 7, wherein annealing the impurity element forms the optical shield with at least one of SiGe or $SiO_2$, and wherein the optical shield is optically aligned with the storage node and prevents image light from reaching the storage node.

9. The method of claim 1, wherein forming the plurality of photodiodes includes forming a region of the photodiode that is at least in part laterally coextensive with an active region of the transfer gate.

10. The method of claim 9, wherein the region of the photodiode is positioned to absorb at least a portion of the image light directed toward the active region of the transfer gate before the portion of the image light reaches the active region.

11. The method of claim 1, further comprising:
    forming an output gate electrically coupled to the storage gate to output the image charge from the storage gate;
    implanting a floating diffusion in the frontside of the semiconductor material, wherein the floating diffusion is coupled to the output gate to receive the image charge; and
    forming an amplifier transistor coupled to the floating diffusion to amplify the image charge in the floating diffusion.

* * * * *